United States Patent [19]
Worley et al.

[11] Patent Number: 5,124,578
[45] Date of Patent: Jun. 23, 1992

[54] RECEIVER DESIGNED WITH LARGE OUTPUT DRIVE AND HAVING UNIQUE INPUT PROTECTION CIRCUIT

[75] Inventors: Eugene R. Worley, Irvine; Howard K. Lane, Laguna Niguel; Winston W. Walker, Irvine, all of Calif.

[73] Assignee: Rockwell International Corporation, Seal Beach, Calif.

[21] Appl. No.: 591,164

[22] Filed: Oct. 1, 1990

[51] Int. Cl.$^5$ .................... H03K 17/16; H03K 19/092
[52] U.S. Cl. ...................................... 307/443; 307/551; 307/557; 307/549; 307/475; 361/56; 361/91; 357/23.13
[58] Field of Search ...................... 307/475, 443, 462.1, 307/549, 565, 296.5, 551, 557, 561; 357/2 B, 13; 361/91, 56

[56] References Cited

U.S. PATENT DOCUMENTS

| | | | |
|---|---|---|---|
| 4,066,918 | 1/1978 | Heuner et al. | 361/56 |
| 4,736,271 | 4/1988 | Mack et al. | 357/23.13 |
| 4,853,560 | 8/1989 | Iwamura et al. | 307/475 |
| 4,876,584 | 10/1989 | Taylor | 357/23.13 |
| 5,017,811 | 5/1991 | Worley | 307/475 |

Primary Examiner—Edward P. Westin
Assistant Examiner—Richard Roseen
Attorney, Agent, or Firm—H. Fredrick Hamann; George A. Montanye; Wilfred G. Caldwell

[57] ABSTRACT

A high voltage level input protection, high capacitance output IC clock receiver uses a ratioed CMOS buffer for the output drive and the receiver includes a low resistance input circuit having a pair of series connected large area input diodes physically located beneath the pad in an input network including a pair of gate controlled diodes in parallel therewith and a low value input resistor connected between the pad diodes and the gate controlled diodes. An N+ resistor receives the CMOS level output on a large metal bus from which metal interconnects fan-out to apply the clock signal to a plurality of loads in synchronism with diminished delay and increased reliability. Thus, reducing the resistance required in the input protection circuit improves the synchronism.

Synchronism between the original clock signal input and the single diminished delay of the clock signal output from the CMOS buffer is maintained due to the 1 nanosecond clock input rise and fall time inherent in the subject clock receiver due to the low impedance (10 ohms) of the under the pad large diodes, the protection network input resistor of extremely low value (60 ohms) which accounts for the fast rise and fall time and permits the use of the large single delay buffer with fast rise and fall time.

10 Claims, 7 Drawing Sheets

RECEIVER DESIGNED WITH LARGE OUTPUT DRIVE AND HAVING UNIQUE INPUT PROTECTION CIRCUIT

BACKGROUND OF THE INVENTION

1. Field of the Invention

This invention relates to an on-chip clock distribution network having high speed due to a low resistance input protection network and with high capacitance output drive utilizing a CMOS ratioed buffer.

2. Prior Art

In digital computer system designs for clock distribution networks it is customary to employ three or more levels of inverting buffers which, of course, introduce various degrees of delay. Non-uniform delay variations in communicating transitions of the system clock to the processor chips by stable elements affect synchronism of the clock to a plurality of output loads. Input delay problems add to the foregoing, as do temperature, and frequency of operation is unduly limited by the number of delays. Also, processing of the wafers and radiation adversely affect clock delays from chip-to-chip. Usually, significant portions of the clock cycle is wasted in order to accommodate the worst case clock delay between chips and a synchronous computer system.

The present invention resolves these problems while minimizing receiver delay.

SUMMARY OF THE INVENTION

A high voltage level input protection, high capacitance output drive integrated circuit receiver uses a ratioed CMOS buffer for the output drive and a low resistance input circuit for the buffer comprising a pair of series connected large area diodes physically located under the integrated circuit pad and connected from the pad metal to both a source of positive potential and ground with a pair of series connected gated (gate controlled) diodes in parallel with the large area diodes and a resistor of very low value connected between the junction of the respective pairs of the diodes to comprise a low resistance input circuit to the high capacitance output buffer circuit, thereby affording minimum RC delay. A low value N+ resistor interconnecting the CMOS high drive level output to a metal distribution bus for supplying high fan-out capacitance loads provides minimum delay in the output while reducing peak current for reliability, and dampens waveform overshoot on the plurality of loads. A primary purpose of the circuit is to serve as a clock receiver with diminished delay time with enhanced reliability and absolute synchronism to a plurality of loads, but other signals may advantageously be handled.

DETAILED DESCRIPTION OF A PREFERRED EMBODIMENT OF THE INVENTION

In general, in a synchronous digital computer, the reduction in the number of delay buffers for distributing the clock on a VLSI chip will increase the maximum throughput or frequency of operation. Also, the on-chip clock delay on one chip will be different due to the variation in the processing of the wafer, when compared to the delay of the clock buffers on a second chip when processed on a different wafer. Consequently, chip-to-chip interfaces must take the worst case clock delay into account by increasing cycle time to afford reliable synchronous register operation. Thus, a significant portion of the clock cycle is wasted to accommodate the worst case clock delay between chips in a synchronous computer system. By using a single large drive CMOS clock receiver 11 (FIGS. 1 and 1A), the clock delay can be dramatically reduced. This large drive clock receiver 11 uses a special low impedance protection circuit for its input network 13. Also, a high current metal interconnect (wide bus 15 and minimum width metal fan-out interconnects of 1.8 micrometers, shown at 17) are required to achieve minimum delay reliable clock distribution on chip.

Also, by placing the large drive capability receiver as a standard cell pad 19 (FIG. 1B), the inherent switching noise is kept out of the VLSI chip core power bus line 16 where the synchronous registers, e.g., 21 are located. The large clock receiver pad 19 provides minimum delay variation over wide temperature, voltage and radiation range. Input protection requires minimum series resistance for minimum delay with large area for power dissipation, and this is shown by the 60 ohm P+ resistor RO1 at 23.

Figure 1:
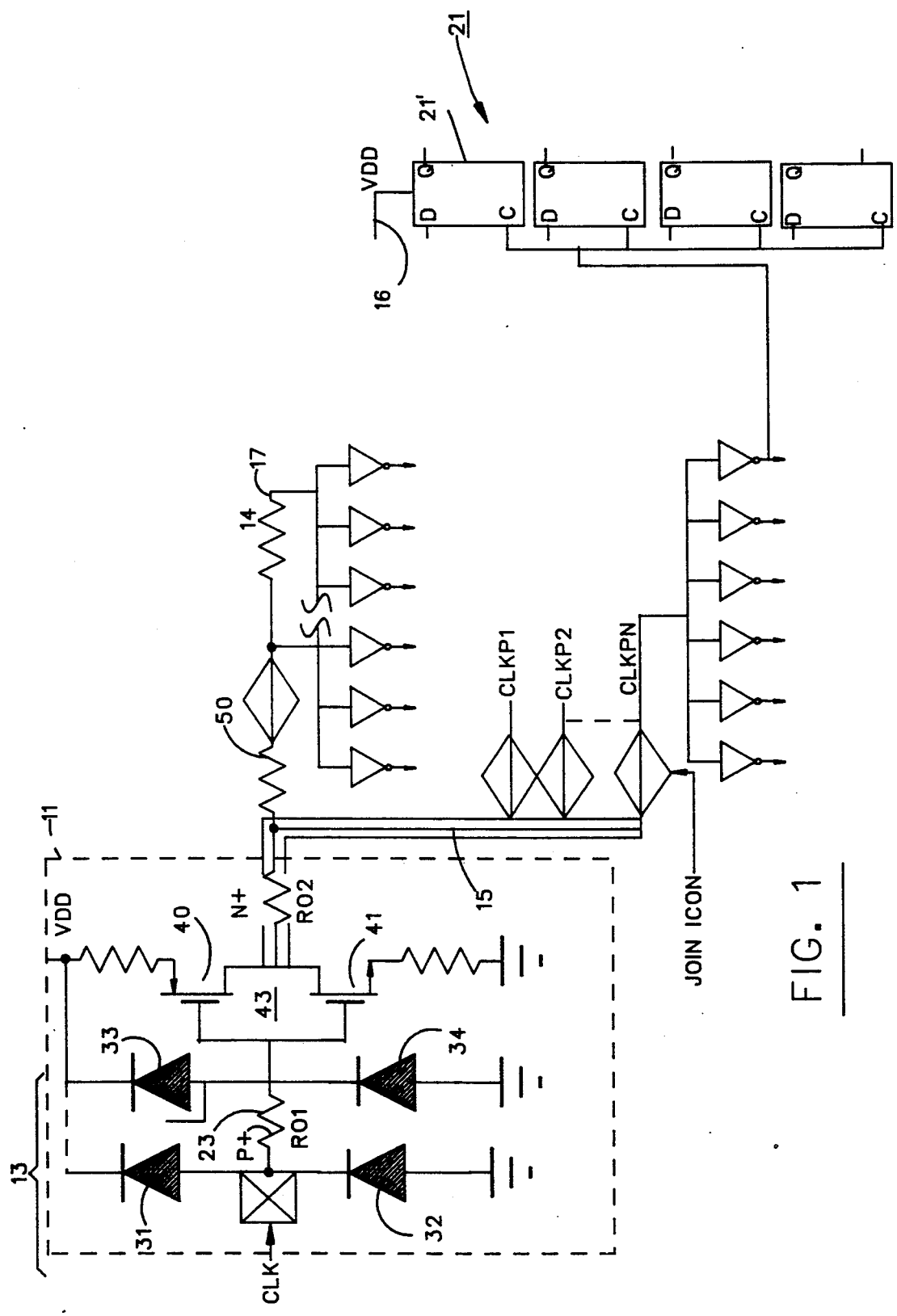
FIG. 1 shows a circuit diagram of the receiver in combination with the fan-out distribution network.
Figure 1A:
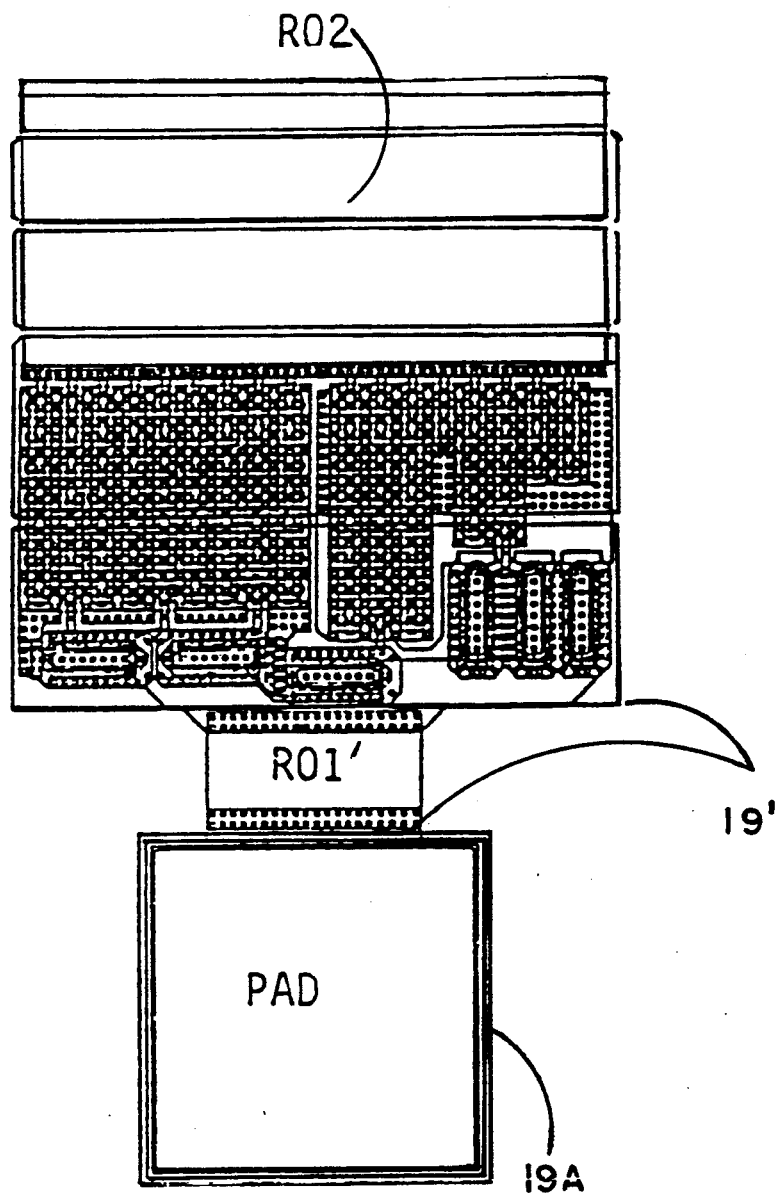
FIG. 1A shows an approach to a clock distribution receiver which is in use.
Figures 1B, 1C:
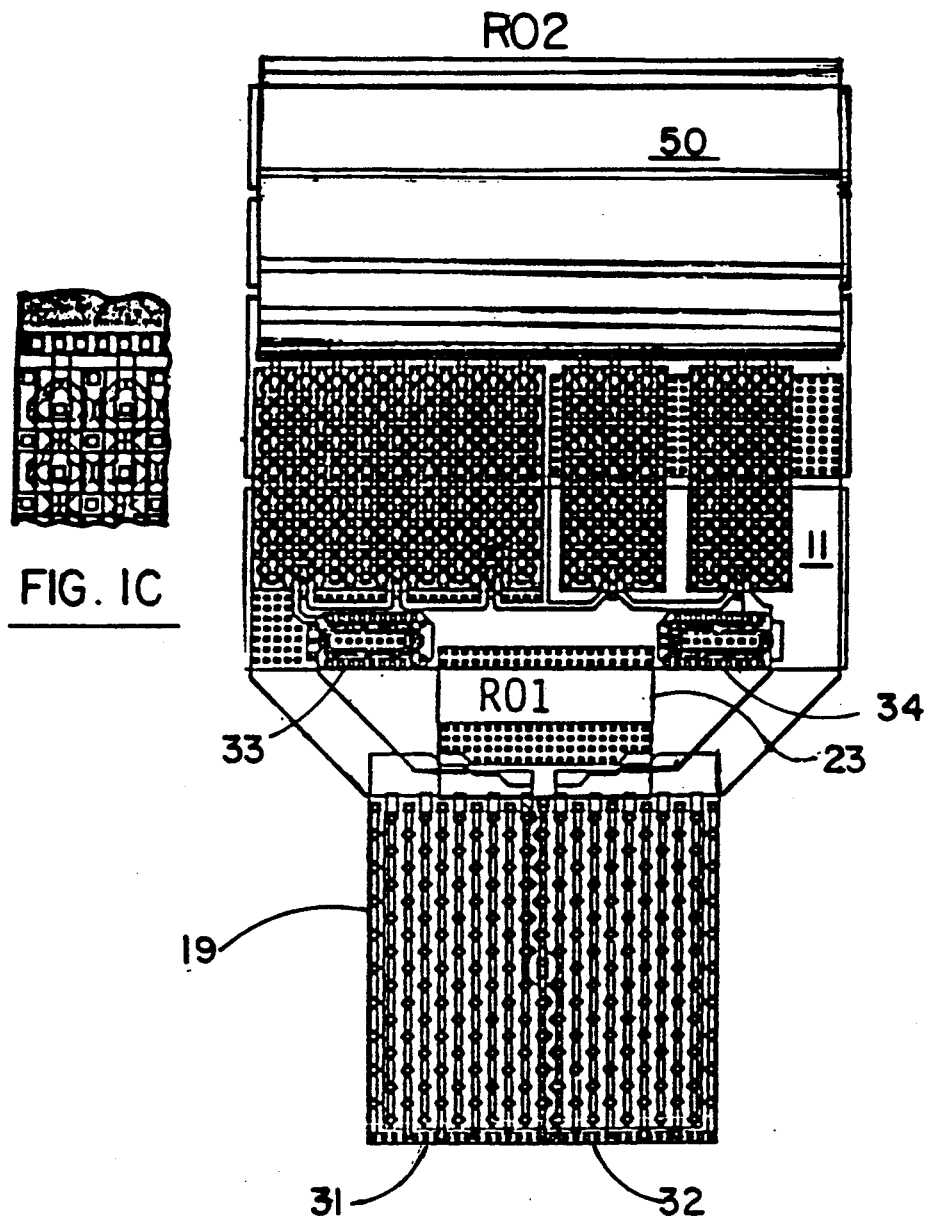
FIG. 1B shows the BASIC layout for the improved protection network with large area diodes under the pad to reduce input delay and shows the receiver, in general, for connection to the clock output bus.
FIG. 1C is an enlarged view of a portion of the structure of FIG. 1B.

FIGS. 1 and 1B show the CMOS receiver 11 with high capacitance output drive designed to eliminate two levels of inverting buffers in the on-chip clock distribution network. It was important to reduce delay variations and communicating transitions of the system clock to the processor chip's bistable elements (see flip flops 21').

Synchronous system timing design requires the sensing of a clock transition at any two chips be simultaneous or differ by a fixed time interval, to within a specified tolerance. In order to reduce this clock transition tolerance by a factor of two, a single stage inverting wide (i.e.) low resistance metal receiver 11 was designed to drive a 30 pf clock distribution bus 15. The large receiver 11 required the special low impedance protection network 13, comprising the resistor 23 between pairs of diodes consisting of large area diodes 31 and 32 connected in series with the pair being connected in parallel with gated or gate controlled diodes 33 and 34, also connected in series between ground and positive VDD at +5 volts potential, the same connections that the large area diodes 31 and 32 have between ground and VDD. This reduces input delay.

Design of this input protection network 13 is based on both limiting the RC delay, and providing a series termination for high frequency clock edges. The new protection network 13 layout is designed to reduce the delay in the RC network without increasing chip area by relocating the major portion of the protection diodes (31 and 32) under the clock input bonding pad 19. This relocation reduces the diode capacitance loading by 60%, as illustrated by comparing the original or presently used input protection network 19' (FIG. 1A) including 6 diodes with the new protection network 13, shown in FIG. 1.

The layout of the FIG. 1A embodiment is the same as the circuit of FIG. 1, except that large area diodes 31 and 32 are not used. This means that the space under pad 19A does not include the diodes, and accordingly, the receiver of FIG. 1A suffers in input protection and delay. Also, the 6 diodes in 19' really are 3 diodes as gated or gate controlled diode 33 and 3 diodes as gated gate controlled diode 34. Otherwise, the layout of FIG. 1A will be the same as in connection with FIGS. 1 and 1B.

In the layout of FIG. 1B, this is seen also at 13 where the two gated (gate controlled) diodes 33 and 34 are shown next to resistor RO1' (resistor 23 of FIG. 1 and 1B) and the diodes 31 and 32 are shown as the 180 tiny diodes (e.g. diodes 31A, 32A with contacts 31A' and 32A' of FIG. 2 and 3) with 90 diodes being connected in parallel to comprise large area diode 31 and the other 90 diodes being connected in parallel to comprise large area diode 32. Each of these large area diodes thus exhibits only about 10 ohms of resistance when forward biased.

This reduced capacitance provides input RC delay of less than 0.3 ns which compares favorably with the receiver delay budget for receiver 11.

In addition to reducing the RC time constant of the protection network 13, the dominant power dissipation is removed from the resistor RO1'', shown at 23. This results from the shunt impedance of the diodes located under the pad 19 having an ON resistance of less than 10 ohm. Thus, the new protection network 13, shown in FIGS. 1 and 1B, provides greater than 2000 volt protection with minimum RC delay and without increasing chip layout area.

To limit the receiver 11 peak-current and improve power dissipation for a best case 1 ns clock input rise and fall time, two special layout design features were used. First, the gate poly of PFET 40 and NFET 41 of the ratioed inverter circuit 43 is laid out using an array of squares with only the corners of each square joined in series. The poly square corners have gate channels forming an "X" with no source or drain available to generate current flow. Consequently, the crossed poly regions provide no power generation at each corner. However, the silicon area below the "X" (crossing poly intersections) provides the needed area to dissipate the power (P=CV²f) generated by the large clock receiver driver.

A second feature to limit the peak current drawn by the driver output capacitance load has been provided by the series N+ resistor RO2'' shown at 50 (FIGS. 1 and 1B). This input resistor also increases the buffer output impedance which reduces the clock cross talk amplitude on interconnect lines adjacent to the clock distribution network.

The value of RO2' (resistor 50) is maintained small, e.g., 20 ohms to limit the added RC delay to less than 0.4 ns at 30 pF clock load capacitance.

Ground rules for far-out loading were developed for the minimum width metal interconnects (1.8 micrometers), shown as interconnect 17, that are joined to the wide metal bus 15 on the output of the clock receiver 11. The ground rules were based on the following equation from J. W. Harrison, Jr. "A SIMULATION MODEL FOR ELECTROMIGRATION IN FINE-LINE METALLIZATION OF INTEGRATED CIRCUITS DUE TO REPETITIVE PULSED CURRENTS," IEEE Transactions on Electron Devices, Vol. 35, Dec. 1988, pages 2170-2179, namely $J_p = Jdc/RM$ where $J_p$ represents the peak current pulse, Jdc is the specified DC current rating for the SOS or SOI process and R is the fraction of time when the repetitive clock current pulse is flowing with M as a derating exponent less than a value of 1.

The receiver layout uses a crossing poly pattern to reduce thermal hot spots and improve reliability. Also, the design ground rules for pulse current loading on the small cross section clock interconnect metallization lines has been related to the DC current rating by Harrison's equation supra.

Figure 2:
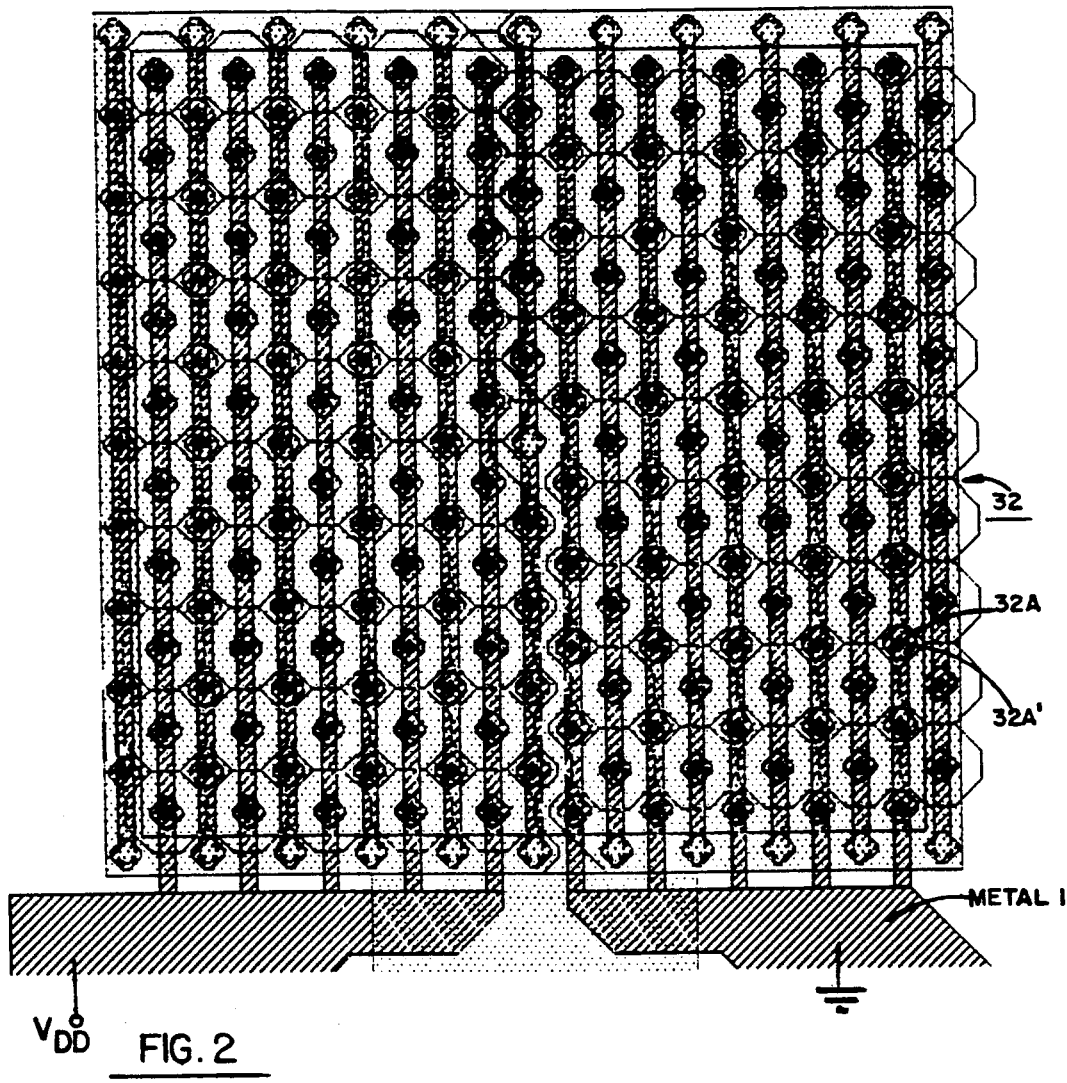
FIG. 2 shows the ASIC layout for some 180 diodes connected in parallel to form the two large area diodes, each with low resistance of about 10 ohms per diode.
Figure 3:
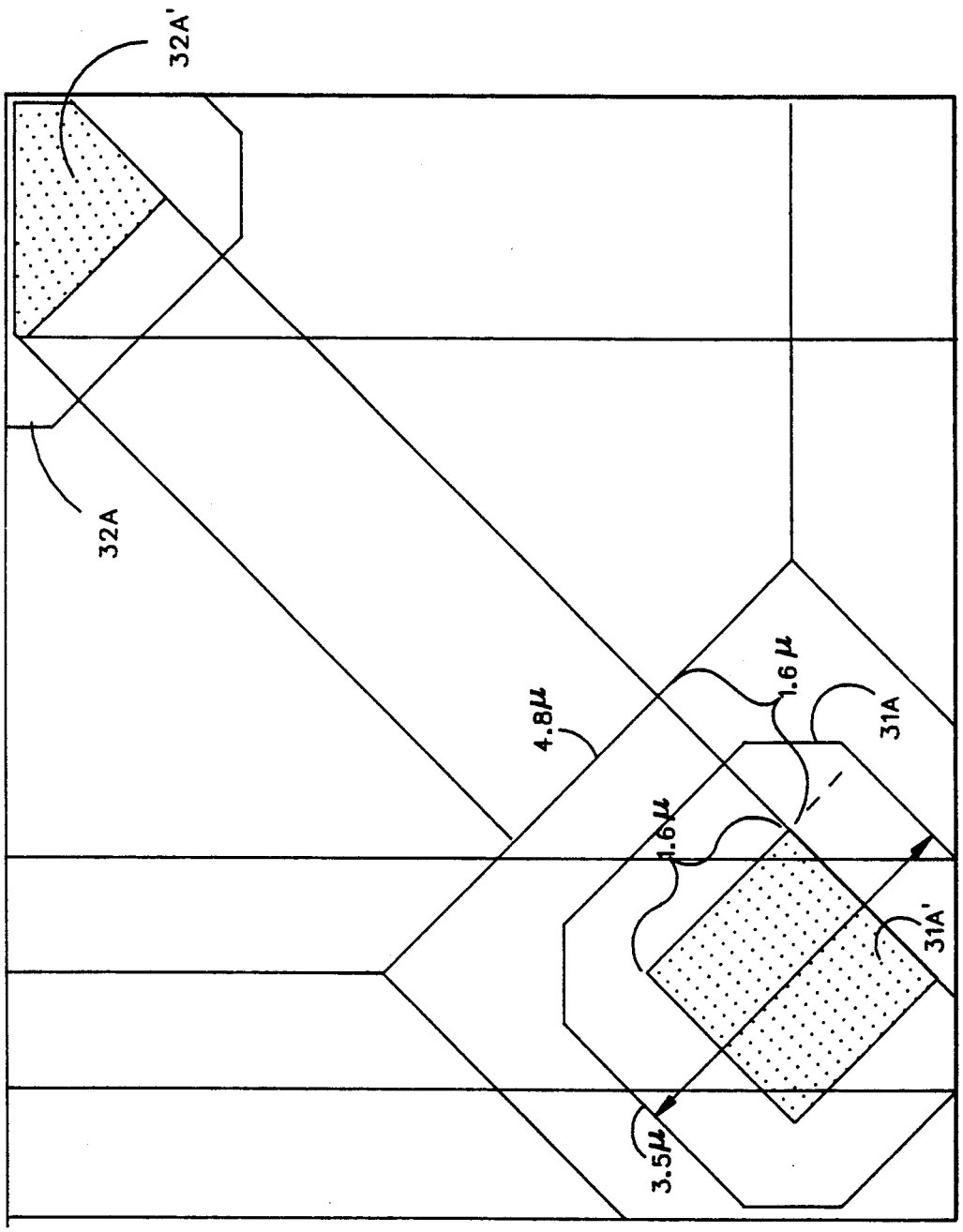
FIG. 3 is an enlarged view of the large area diodes layout under the pad complete with contacts and dimensions.

FIG. 3 shows large area diodes 31A and 32A in exact layout with a 6 micron separation between respective contacts 31A', and 32A'. The contacts each measure 1.6 by 1.6 microns and the diodes are 3.5 microns wide and long. Of course, the detailed construction is as explained in the description of FIG. 2.

Figure 4:
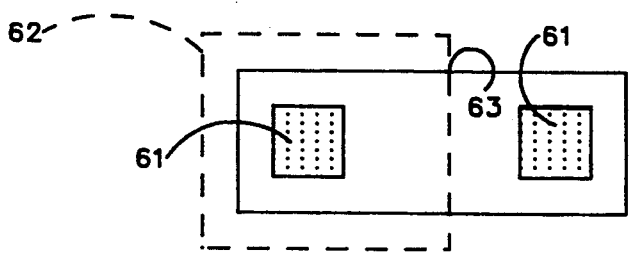
FIG. 4 shows, by way of example, a P+ P−/N+ diode layout comprising one of the large area diodes.

FIG. 4 shows a P+P−/N+ diode useful as one of the large area diodes 31 and 32. By large area is meant a dimension of approximately 109 micrometers, as shown at the top of FIG. 2 for the pair of diodes 31 and 32.

Returning to FIG. 4, the contact for the diode is represented by the metal 61 and the respective doped regions are 62 for the P+ region and 63 for the P− region, with these regions shown overlapped as they are different layers.

Figure 5:
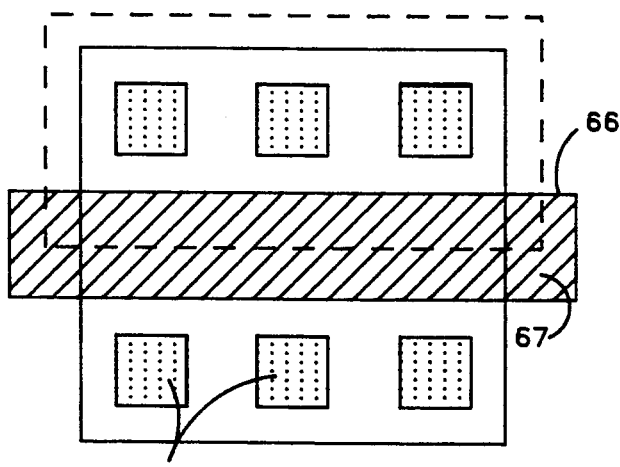
FIG. 5 shows a gated diode layout similar to the type used in the receiver.

In FIG. 5, there is an example of a gated or gate controlled diode shown with a P layer 66 and an N layer 67 with a series of like contacts, shown at 68.

Figure 6:
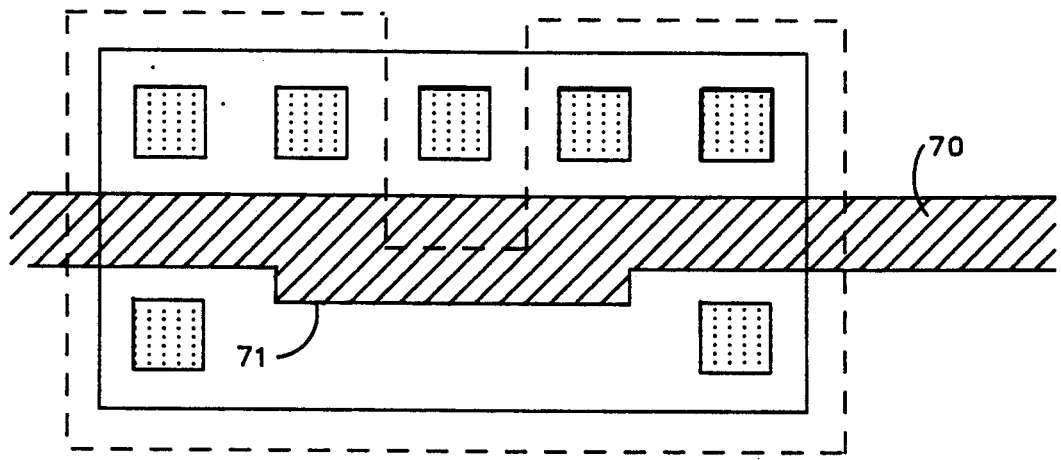
FIG. 6 shows, by way of example, a PFET with gate body tie layout, and similar techniques are used with the NFET gate body tie.

In FIG. 6 an example of a PFET, e.g., 40 where a body-tie is shown with the doped regions 70 and 71. It should be noted that the body tie is unnecessary for bulk CMOS because it is automatically in the process but can be used for SOI and SOS to shift the threshold point.

Normally, the PFET 40 and NFET 41 are left floating. However, if they are tied, both are tied or both float.

Figure 7:
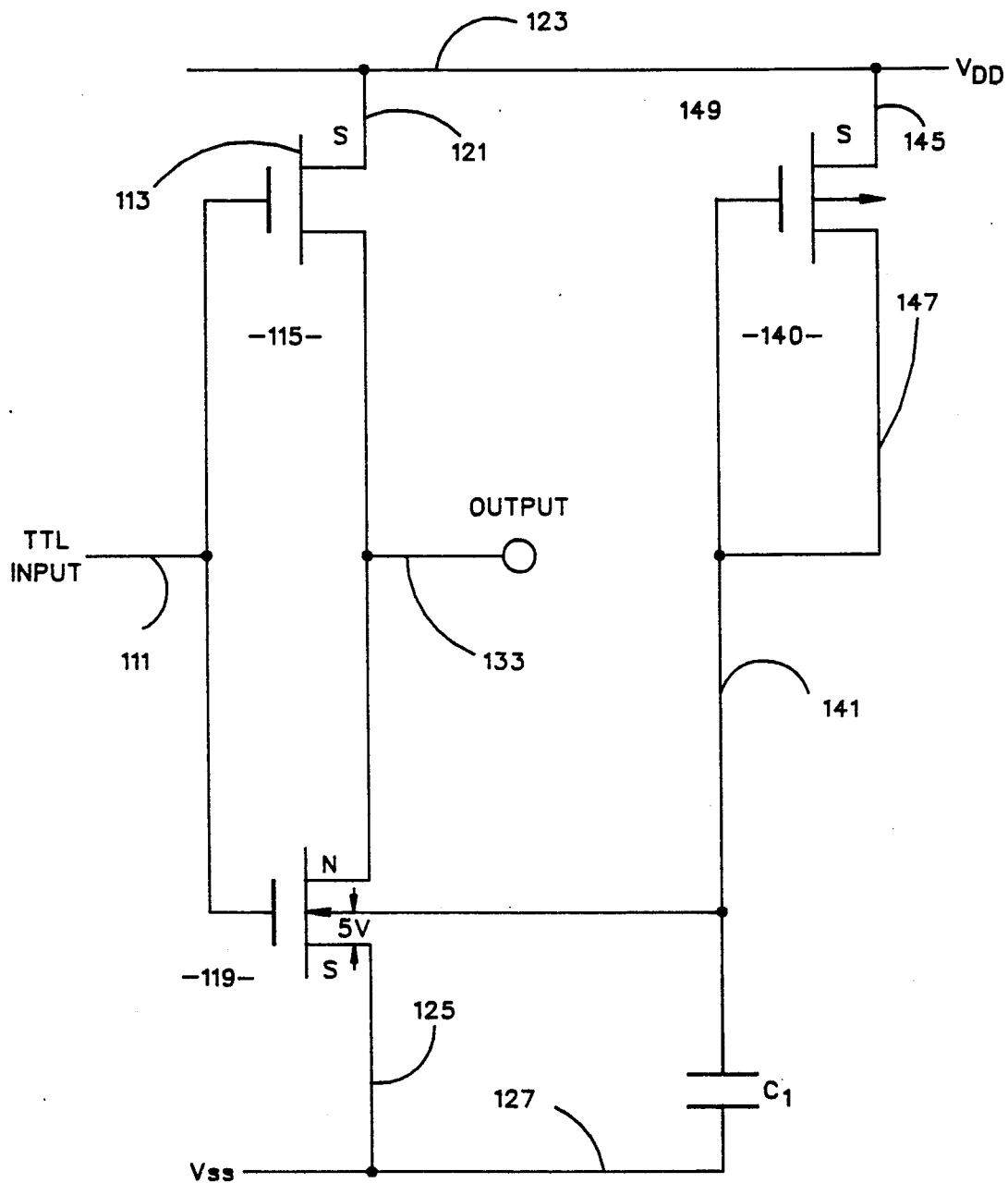
FIG. 7 shows a circuit diagram for a CMOS buffer with provision for bias applied to the substrate.

In FIG. 7, there is shown an extension of the ratioed inverter circuit 43 to provide a forward bias to the body of the NFET 119 corresponding to NFET 41 of FIG. 1.

In the circuit shown in FIG. 7, a TTL level input is applied to lead 111, directly connected to the gate 113 of PFET 115, also directly connected to the gate 117 of an NFET 119.

The source of the PFET 115 is connected over lead 121 to the $V_{DD}$ supply line 123. The source of the NFET 119 is connected over lead 125 to supply line 127 for the $V_{SS}$ supply source. The drain of the PFET 115 is connected over lead 131 to the output lead 133 and the drain of the NFET 119 is connected over lead 135 to the output lead 133.

It may be seen that the PFET 115 and NFET 119 are simply connected as a ratioed inverter circuit.

A biasing source, in the form of, e.g., PFET 140, is provided to apply a tiny current over lead 141 to the body of NFET 119. The source of the PFET biasing source is connected over lead 145 to the $V_{DD}$ source and the drain of the biasing PFET 140 is connected over lead 147 to its own gate 149, thereby forming a constant current source to supply biasing current over the lead 141 to the body portion of the NFET 119. This biasing current may be of the order of 1.5 micro-amps and even 1.0 micro-amps should be sufficient when working with many of these circuits on a chip. The inverter circuit is thus comprised of the pull up PFET 115 and the pull down NFET 119.

Design considerations include the addition of bypass capacitor C1 in FIG. 7 since the substrate node has a high impedance and is, therefore, susceptible to bumping by the NFET gate or by adjacent lines SOS. Also, the distributed RC time constant of the substrate has to be considered when determining the frequency with which substrate tie points are made for SOS transistors.

For an edgeless transistor with a width of 100 micrometers, only 1.5 micro amps of body-source current is required to achieve a body to source voltage of 0.5 volts. This bias voltage lowers the NFET threshold by 0.45 volts. The edgeless PFET biasing source 140 has a very low width to length ratio (4 micrometers/350 micrometers) for the circuit of FIG. 7.

By way of example, PFET 115 may be formed by CMOS/SOS conventional processing with a channel width to length ratio of 12μ to 1.6μ and doped approximately $2 \times 10^{16}$ atoms per c.c. NFET 119 is formed by the same processing with a W/L ratio of 96μ to 1.6μ and a channel doping of about $1 \times 10^{17}$ atoms/c.c. Otherwise, the Engineer may design cells with the sizing being determined by the desired drive. $V_{SS}$ is usually +5 volts and $V_{SS}$ is zero volts or ground.

The body current supplied by biasing PFET 140 has a relatively small impact on the body voltage variation with temperature. The threshold voltage of this device varies from about 1.03 to about 1.32 volts over a temperature swing of −60 to 125 degrees centigrade.

The main component of the temperature variation for the body voltage lies with forward voltage drop of the body to source diode which has a temperature coefficient of about −1.9 millivolts/C. Thus, as the temperature increases, the body voltage decreases, causing the threshold voltage to rise. Compensating for this rise in threshold voltage is the temperature coefficient of the threshold voltage which causes the threshold to decrease. These two competing effects result in the threshold voltage which is relatively stable with temperature. The threshold variation with temperature is small for the forward biased case when compared with the body grounded case. Thus, not only is the threshold voltage of the NFET lowered by the application of a body-source diode current, but the threshold temperature coefficient approaches 0.

Thus, it may be seen that the receiver 11 may operate solely on CMOS or may convert TTL to CMOS level. Also, it may operate with or without the forward bias, providing complete flexibility of operation.

What is claimed is:

1. A high capacitance output drive integrated circuit receiver with input protection, comprising in combination:

an integrated circuit substrate;
a pad for the receiver on the substrate;
a ratioed CMOS buffer;
an input circuit for the buffer comprising a pair of series connected large area diodes physically located under the pad and occupying substantially the area under said pad and said diodes being connected between a source of positive potential and ground;
a pair of series connected gate controlled diodes in parallel with the large area diodes;
a resistor of low value of approximately 60 ohms connected between the junction of each pair of diodes;
the buffer comprising a series connected CMOS PFET and CMOS NFET for receiving CMOS input signals via said resistor and outputting a CMOS level output;
an N+ resistor receiving the CMOS level output;
a metal distribution bus connected to the N+ resistor; and,
fan-out loading means connected to the bus for receiving output drive delayed by a single buffer.

2. The receiver of claim 1, wherein:
the loading means are bistable circuits; and,
the large are diodes receive a clock signal and the receiver directs the clock signal, with a single buffer delay, to said bus for synchronous distribution of the delayed signal to each of said bistable circuits.

3. The receiver of claim 1, wherein:
the large area diodes each comprise a plurality of small diodes connected in parallel and characterized by a total resistance of approximately 10 ohms.

4. The receiver of claim 1, wherein:
said buffer further comprises a source of bias voltage applied to the body of the NFET in the integrated circuit substrate.

5. A high capacitance output drive integrated circuit receiver with input protection, comprising in combination:

An integrated circuit substrate;
a pad for the receiver on the substrate;
a ratioed CMOS buffer;
an input circuit for the buffer comprising a pair of series connected large area diodes disposed under the receiver pad and connected between a source of positive potential and ground;
each large area diode comprising about 90 individual diodes connected in parallel and the area of both large area diodes comprising about 10,000 square microns;
a pair of series connected gate controlled diodes in parallel with the large area diodes,
an input resistor of about 60 ohms connected between the junction of each pair of diodes;
the buffer comprising a series connected CMOS PFET and CMOS NFET for receiving a CMOS input signals via said resistor and outputting a CMOS level output;
biasing means connected to the body of the NFET to apply a forward bias current for lowering the threshold voltage of the NFET;
a doped resistor receiving the CMOS level output;

a metal distribution bus connected to the doped resistor; and fan-out loading means connected to the bus for receiving output drive delayed by a single buffer.

6. The receiver of claim 5, wherein:

said bus is characterized by a width of approximately 100 microns.

7. The receiver of claim 6, further comprising:

an inverter circuit connected in the fan-out loading means to compensate for the inversion in the ratioed buffer.

8. The receiver of claim 5, wherein: the doped resistor has about 20 ohms.

9. The receiver of claim 5, wherein:

said input circuit receives a clock signal; and, the fan-out loading means comprise clock input bistable circuits connected to the bus respectively to receive clock signal delayed by a single buffer delay.

10. A high capacitance clock output drive integrated circuit receiver with input protection, comprising in combination:

a silicon integrated circuit substrate on insulator;

a pad for the receiver on the substrate;

a ratioed CMOS buffer;

an input circuit for the buffer comprising a pair of series connected large area diodes and a pair of series connected gate controlled diodes, both pairs connected between a source of positive potential and ground;

said large area diodes disposed beneath said pad, and each comprising about 90 individual diodes connected in parallel to exhibit only about 10 ohms of resistance per large area diode when forward biassed and occupying at least a major portion of the area under said pad;

an input resistor of about 60 ohms connected between the junction of each pair of diodes and the buffer;

said buffer comprising a series connected CMOS PFET and CMOS NFET for receiving CMOS input signals via said resistor and outputting a CMOS level output;

biasing means connected to the body of the NFET to apply a forward bias current for lowering the threshold voltage of the NFET;

a doped resistor receiving the CMOS level output;

a metal distribution bus connected to the N+ resistor; and, means for connecting fan-out loading means to the bus for receiving minimum delayed output in synchronism to the clock signal for each of the loading means.

* * * * *

UNITED STATES PATENT AND TRADEMARK OFFICE
CERTIFICATE OF CORRECTION

PATENT NO. : 5,124,578
DATED : June 23, 1992
INVENTOR(S) : Eugene R. Worley, et. al.

It is certified that error appears in the above-indentified patent and that said Letters Patent is hereby corrected as shown below:

Column 6, claim 2, line 3, change "are" to --area--.

Signed and Sealed this

Twenty-eighth Day of September, 1993

*Attest:*

*Attesting Officer*

BRUCE LEHMAN

*Commissioner of Patents and Trademarks*